United States Patent
Larsen et al.

[11] Patent Number: 6,154,819
[45] Date of Patent: Nov. 28, 2000

[54] APPARATUS AND METHOD USING VOLATILE LOCK AND LOCK-DOWN REGISTERS AND FOR PROTECTING MEMORY BLOCKS

[75] Inventors: Robert E. Larsen, Shingle Springs; Peter Hazen, Auburn; Sanjay S. Talreja; Sandeep Guliani, both of Folsom; Robert N. Hasbun, Placerville; Collin Ong, Sacramento, all of Calif.; Terry D. West, Chandler, Ariz.; Charles Brown, Folsom; Terry L. Kendall, Diamond Springs, both of Calif.

[73] Assignee: Intel Corporation, Santa Clara, Calif.

[21] Appl. No.: 09/076,298

[22] Filed: May 11, 1998

[51] Int. Cl.$^7$ ........................................................ G06F 12/14
[52] U.S. Cl. ............................ 711/163; 711/103; 711/152; 711/173; 365/185.33
[58] Field of Search ....................................... 711/152, 103, 711/154, 167, 163, 173; 713/200; 365/185.33

[56] References Cited

U.S. PATENT DOCUMENTS

| | | | |
|---|---|---|---|
| 5,065,364 | 11/1991 | Atwood et al. | 365/185 |
| 5,126,808 | 6/1992 | Montalvo et al. | 357/23.5 |
| 5,197,034 | 3/1993 | Fandrich et al. | 365/227 |
| 5,293,424 | 3/1994 | Holtey et al. | 380/23 |
| 5,297,148 | 3/1994 | Harari et al. | 371/10.2 |
| 5,438,546 | 8/1995 | Ishac et al. | 365/200 |
| 5,513,136 | 4/1996 | Fandrich et al. | 365/185.04 |
| 5,592,641 | 1/1997 | Fandrich et al. | 395/430 |
| 5,974,500 | 10/1999 | Maletessky | 711/103 |

*Primary Examiner*—Hiep T. Nguyen
*Attorney, Agent, or Firm*—Blakely, Sokoloff, Taylor & Zafman LLP

[57] ABSTRACT

An apparatus for protecting memory blocks in a block-based flash Erasable Programmable Read Only Memory (EPROM) device is disclosed. A non-volatile memory array includes a number of blocks that are capable of being placed in a locked state or an unlocked state. A volatile lock register and transmits a write protect signal and a volatile lock-down register are coupled to a lockable block in the volatile memory array. A hardware override line is coupled to both the lock register and the lock-down register. The hardware override line temporarily overrides operation of the lock-down register when it transmits a signal at a first logic state. The lock down register may be used to prevent programming of an associated lock register. The lock registers and lock down registers may be embodied in static access memory (SRAM) circuits. A command buffer may be operable to transmit a two cycle command including a first command specifying whether a lock configuration is to be changed and a second command specifying whether a block is to be placed in a lock state, an unlock state, or locked down state. The lock down registers may be capable of being set to lock down only once during a period in which the apparatus is powered up.

11 Claims, 10 Drawing Sheets

LOCK STATUS STATE TABLE

600

| CURRENT BLOCK LOCK STATE | | | | ERASE/ PROGRAM ALLOWED? | LOCK COMMAND INPUT RESULT (NEXT STATE) | | |
|---|---|---|---|---|---|---|---|
| WP# | $DQ_1$ | $DQ_0$ | STATE | | LOCK | UNLOCK | LOCKDOWN |
| 0 | 0 | 0 | Unlocked | Yes | Goes to [001] | No Change | Goes to [011] |
| 0 | 0 | 1 | Locked | No | No Change | Goes to [000] | Goes to [011] |
| 0 | 1 | 0 | Lockdown | No | No Change | No Change | No Change |
| 0 | 1 | 1 | LockDown | No | No Change | No Change | No Change |
| 1 | 0 | 0 | Unlocked | Yes | Goes to [101] | No Change | Goes to [111] |
| 1 | 0 | 1 | Locked | No | No Change | Goes to [100] | Goes to [111] |
| 1 | 1 | 0 | Unlocked | Yes | Goes to [111] | No Change | Goes to [111] |
| 1 | 1 | 1 | Locked | No | No Change | Goes to [110] | No Change |

FIG. 6

COMMAND BUS DEFINITIONS

700

| COMMAND | FIRST BUS CYCLE | | | SECOND BUS CYCLE | | |
|---|---|---|---|---|---|---|
| | OPER | ADDR | DATA | OPER | ADDR | DATA |
| Lock Block | Write | X | 60H | Write | BA | 01H |
| Unlock Block | Write | X | 60H | Write | BA | D0H |
| Lockdown Block | Write | X | 60H | Write | BA | 2FH |

COMMAND CODES AND DESCRIPTIONS

| DATA | COMMAND | FUNCTION |
|---|---|---|
| 60 | Configuration Set Up | Prepares the CUI for changes the device configuration, such as block locking changes. If the next command is not Block Unlock, Block Lock, or Block Lock-Down, then the CUI will set both the Program and Erase Status register bits to indicate an invalid command. |
| 01 | Lock-Block | If the previous command was Configuration Set-Up, the CUI will latch the address and lock the block indicated on the address pins. |
| 2F | Lock-Down | If the previous command was a Configuration Set-Up command, the CUI will latch the address and lock-down the block indicated on the address pins. |
| D0 | Erase Confirm | If the previous command was an Erase Set-Up command, then the CUI will close the address and data latches, and begin erasing the block indicated on the address pins. During program/erase, the device will respond only to the Read Status Register, Program Suspend and Erase Suspend commands and will output status register data when CE# or OE# is toggled. |
|  | Program/Erase Resume | If a program or erase operation was previously suspended, this command will resume that operation. |
|  | Unlock Block | If the previous command was Configuration Set-Up, the CUI will latch the address and unlock the block indicated on the address pins. If the block had been previously set to Lock-Down, this operation will have no effect. |

FIG. 8

APPARATUS AND METHOD USING VOLATILE LOCK AND LOCK-DOWN REGISTERS AND FOR PROTECTING MEMORY BLOCKS

CROSS REFERENCE TO RELATED APPLICATIONS

The present application is related to the following co-pending U.S. patent applications entitled, "Volatile Lock Architecture for Individual Block Locking on Flash Memory", having application Ser. No. 09/076,330, filed on May 11, 1998; and "A Method and Apparatus for Hardware Block Locking in a Non-Volatile Memory", having application Ser. No. 09/078,094, filed on May 11, 1998, both applications of which are assigned to the assignee of the present invention.

FIELD OF THE INVENTION

The present invention relates generally to integrated circuit memory devices, and more specifically to lock protecting memory blocks in a non-volatile memory array.

BACKGROUND OF THE INVENTION

Flash EPROM (erasable programmable read-only memory) devices have developed into a popular source of non-volatile, electrically erasable memory in a wide range of digital applications. Flash memory devices typically use a one-transistor memory cell which allows for high memory densities, high reliability, and low power consumption. These characteristics have made flash memory very popular for low power applications, such as battery-backed or embedded memory circuits. Common uses of non-volatile memory include portable computers, Personal Digital Assistance (PDA) devices, digital cameras, and cellular telephones. In these devices, both program code and system data, such as configuration parameters and other firmware, are often stored in flash memory because of the compact storage and relative ease of software upgradeability. The use of flash memory to store upgradeable data has necessitated the development of mechanisms to protect the data from unintended erasure or reprogramming.

With original flash memory devices, erasing stored code or data required erasing the entire device. Newer devices, however, are based on a block-erase architecture in which the flash memory is divided into blocks that are loosely analogous to the disk sectors recognized by disk operating systems. This block based architecture allows file systems to erase blocks of flash memory instead of the whole device. The block architecture also allows users to flexibly erase different portions of code or data in a flash device. For example, critical system code, such as boot code, can be stored in a lockable "boot block" of the device, while other blocks are allocated to other portions of code or data.

To ensure the integrity of block-based flash memory, block protection schemes are needed to protect stored data when the memory is modified through program or erase operations. Memory blocks must be protected against unintended writes when data is written to the device or when a new code segment is updated. Likewise, data blocks must be protected when other data blocks are modified or when code updates occur.

One present method of block protection for flash memory includes protecting a pre-determined number of blocks through a lock/unlock hardware pin. This requires the user to determine which blocks of memory are hardware protectable and reserve those blocks for critical data or program code. This approach is highly inflexible in that the user can only protect code or data in these pre-determined hardware protectable blocks.

A second present method of block protection for flash memory includes the use of a block locking configuration table that is stored in the flash memory device itself. Typically the configuration is stored in a flash mini-array that is separate from the main flash memory array. Each bit in the configuration table represents a block that can be either locked or unlocked. This approach, however, has several disadvantages. One disadvantage is the excessive latency incurred in locking or unlocking individual blocks of memory. For example, in a typical flash device, on the order of ten microseconds are required to program a lock bit and one second is required to erase a lock bit. In systems in which code is being executed on the order of thousands of megahertz, these long cycle times required to protect memory blocks can to protect memory blocks can create create periods of vulnerability in which data corruption may occur.

Another disadvantage to this method is that, because the table is implemented in a dedicated flash mini-array, in which individual bits represent the different lockable blocks, reprogramming a particular block typically requires erasing the entire set of bits in the table, instead of only the bit for that block. Thus, reconfiguring even a single block incurs the erase cycle times for each of the bits in the table and the associated vulnerability to data corruption of these bits during the relatively long erase times.

An additional disadvantage of the flash based configuration table is that it occupies valuable die space in the flash device and each bit in the table requires associated flash sense, and program and erase circuitry.

Therefore, present methods of block protecting flash memory present several significant disadvantages, including inflexibility of lock configuration, higher costs due to addition of a flash mini-array, and possible data corruption due to vulnerability resulting from long program and erase cycle times.

SUMMARY OF THE INVENTION

A method and an apparatus are disclosed for protecting memory blocks in a block-based flash EPROM device. A block controller is coupled to a non-volatile memory array. The non-volatile memory is a block-based array that contains a number of lockable blocks. The block lock controller contains a set of volatile lock registers and a set of volatile lock-down registers. Each lockable block is coupled to a lock register and a lock-down register. A hardware override line is coupled to the lock register and the lock-down register. The hardware override line operates to override the function of the lock down register when it transmits a signal at a first logic level.

In one embodiment of the present invention, a lock register sets a corresponding lockable block in the non-volatile memory array to either a locked or unlocked state. A locked block is protected against modification from subsequent write or erase operations, while an unlocked block can be programmed or erased. A lock-down register sets the lock-down state of a corresponding lockable block in memory. A locked-down block cannot be modified by subsequent write or erase operations and cannot be unlocked by reprogramming the corresponding lock registers through normal software commands. A hardware override line allows temporary override of the lock-down register and allows unlocking of a block through software commands.

Other features and advantages of the present invention will be apparent from the accompanying drawings and from the detailed description that follows.

BRIEF DESCRIPTION OF THE DRAWINGS

The present invention is illustrated by way of example and not limitation in the figures of the accompanying drawings, in which like references indicate similar elements, and in which:

FIG. 6 is a table illustrating the bit configuration for the lock status state for the block lock controller of FIG. 5, according to one embodiment of the present invention;

FIG. 7 is a table illustrating command bus definitions for the block lock controller of FIG. 5, according to one embodiment of the present invention;

FIG. 8 is a table illustrating the command codes and description of the commands for the block lock controller of FIG. 5, according to one embodiment of the present invention;

DETAILED DESCRIPTION

A block protection control circuit for a flash memory array is described. In one embodiment of the present invention, a set of volatile memory lock registers sets each lockable block of the flash memory to a locked or unlocked state. A set of volatile memory lock-down registers protects the lock status of each lockable block against reprogramming of the lock registers. A hardware override signal is provided to allow temporary override of the lock-down registers.

Figure 1:
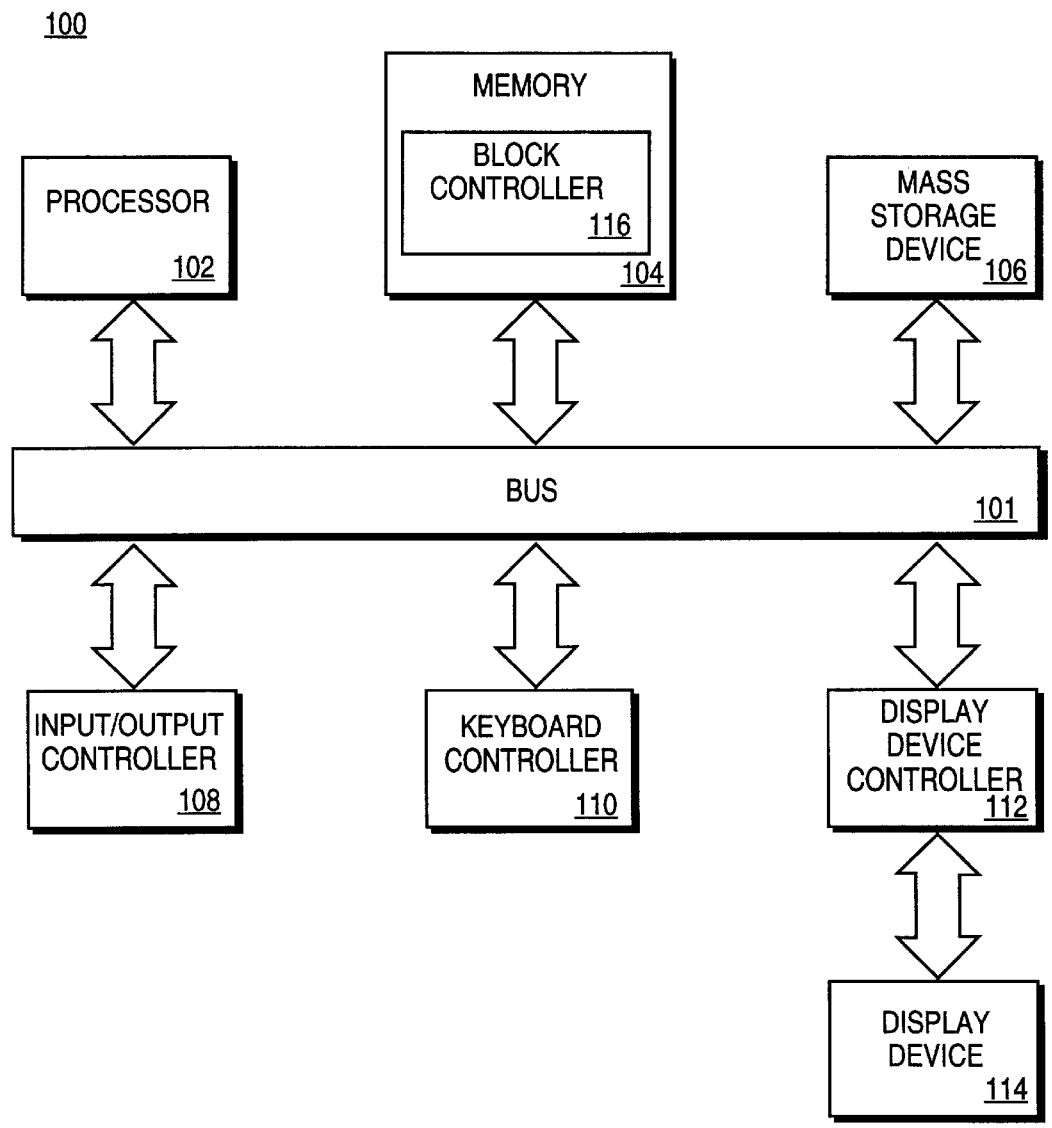
FIG. 1 is a block diagram of a computer system that includes an embodiment of the present invention.

It is an intended advantage of embodiments of the invention to provide a block protection controller for flash memory that allows a user to dynamically select which blocks of a flash memory array to lock or unlock. It is a further intended advantage of embodiments of the invention to provide a block control circuit that locks or unlocks blocks of flash memory at high speeds and minimizes the possibility of data corruption during block lock and unlock cycles. FIG. 1 illustrates a block diagram of a computer system that incorporates embodiments of the present invention. The computer system 100 includes a processor 102 coupled through a bus 101 to a memory 104 and a mass storage device 106. In certain embodiments of the present invention, memory 104 is random access memory ("RAM"), read-only memory ("ROM"), or other non-volatile memory, such as flash memory; and mass storage device 106 is a large-capacity persistent storage device, such as a hard disk drive, CD-ROM drive, or tape drive. A keyboard controller 110 is coupled to bus 101 for receiving commands or data entered through a keyboard, mouse, or similar input device. A display device controller 112 is also coupled to bus 101 for providing output through an appropriately coupled display device 114. Also coupled to bus 101 is an input/output controller 108 for interfacing processor 102 to other devices, such as network interface devices and the like.

In one embodiment of the present invention, memory 104 is a block-erase architecture type of flash EPROM memory. Memory 104 includes a block controller unit 116 that configures the blocks within memory 104 in either a locked or unlocked state. The composition and operation of embodiments of block controller unit 116 will be provided in greater detail in the discussion that follows.

It should be noted that the architecture of FIG. 1 is provided only for purposes of illustration, and that a computer system that implements embodiments of the present invention is not limited to this specific architecture. For example, flash memory is often prominently used in digital devices other than computer systems. Such devices, as exemplified by cellular telephones, pagers, digital cameras, and personal digital assistants, typically include a microprocessor or other processing unit, and a flash memory device that is used to store program code and system data.

Figure 2:
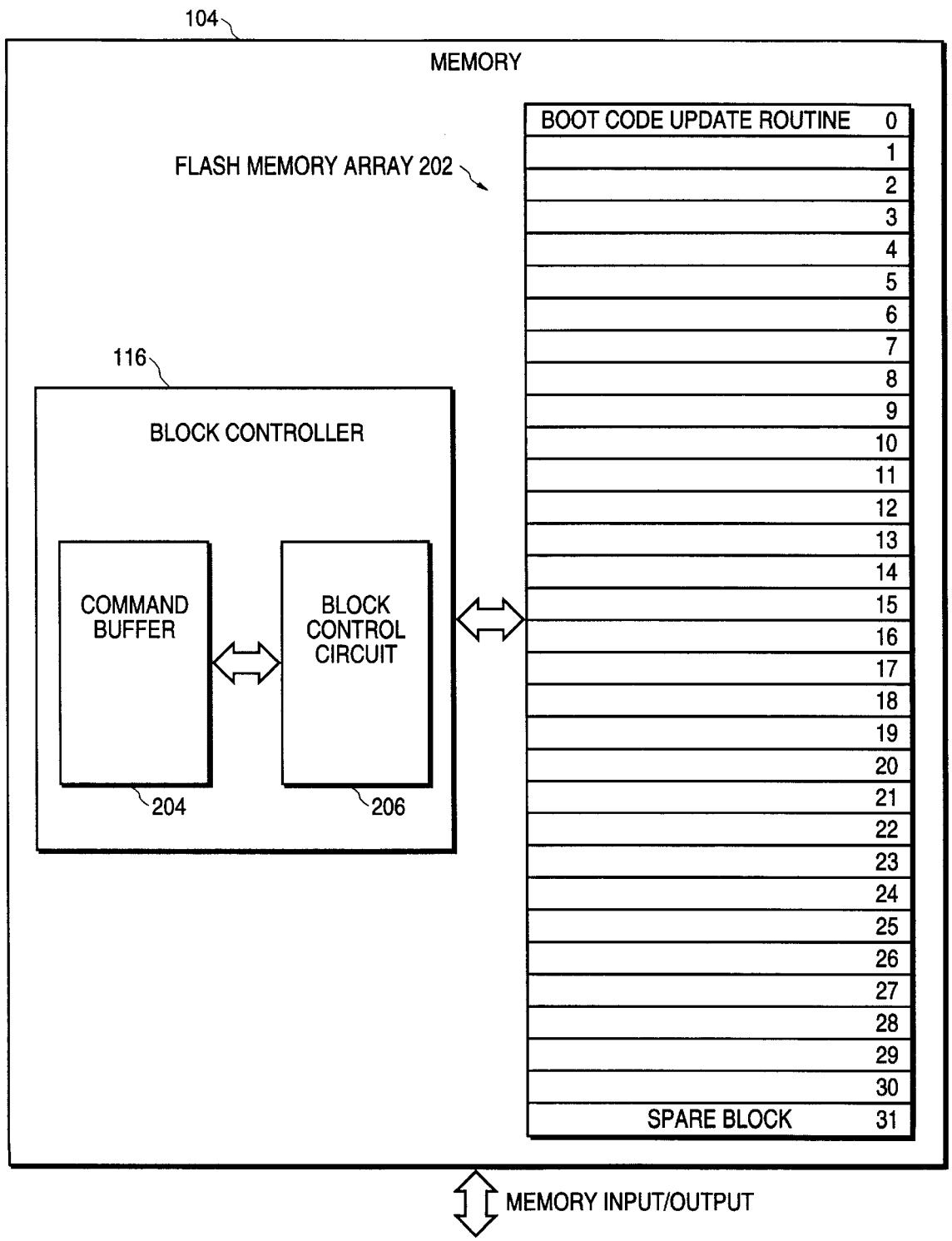
FIG. 2 is block diagram of a block controller coupled to a flash memory array, according to one embodiment of the present invention.

FIG. 2 is a block diagram that illustrates the interface between the block controller unit 116 and a flash memory array 202 according to one embodiment of the present invention. Memory 104 includes a flash memory array 202 that is divided into a number of memory blocks. As illustrated in FIG. 2, flash memory array 202 includes 32 blocks numbered blocks 0 to 31. It is to be noted, however, that a flash memory device with any number of blocks may be used in conjunction with embodiments of the present invention. In a typical application, a specific block of the memory array may be a "boot block" that stores boot code for a computer or similar processing system, and one or more blocks, e.g., block 31, are reserved as spare blocks. Each of the remaining blocks is then available to store either additional program code or data. As illustrated in FIG. 2, the first block (block 0) is the boot block, however, the location of the boot block may vary among different computer systems, and depends on the memory address mapping scheme implemented in the actual computer system.

One or more of the blocks in flash memory array 202 is capable of being locked. A locked block is protected against program or erase operations. Flash memory array 202 is coupled to block controller unit 116 that controls the lock and unlock configuration of each of the lockable blocks in memory 104. Block controller unit 116 includes a command buffer 204 that receives read/write commands from the processor. Command buffer 204 is coupled to block control circuit 206. In one embodiment of the present invention, block control circuit 206 contains a number of digital registers, with each register controlling the lock status of a corresponding lockable block. In response to a particular lock or unlock command received from command buffer 204, block control circuit 206 generates the appropriate control signal to flash memory array 202 to configure the blocks accordingly. Block control circuit 206 also serves as a status register that is polled when the processor attempts to erase or write to a locked block. Block control circuit 206 can thus be configured to issue a status or error message in response to an invalid erase or write command.

Volatile Latch Block Lock Architecture

Figure 3:
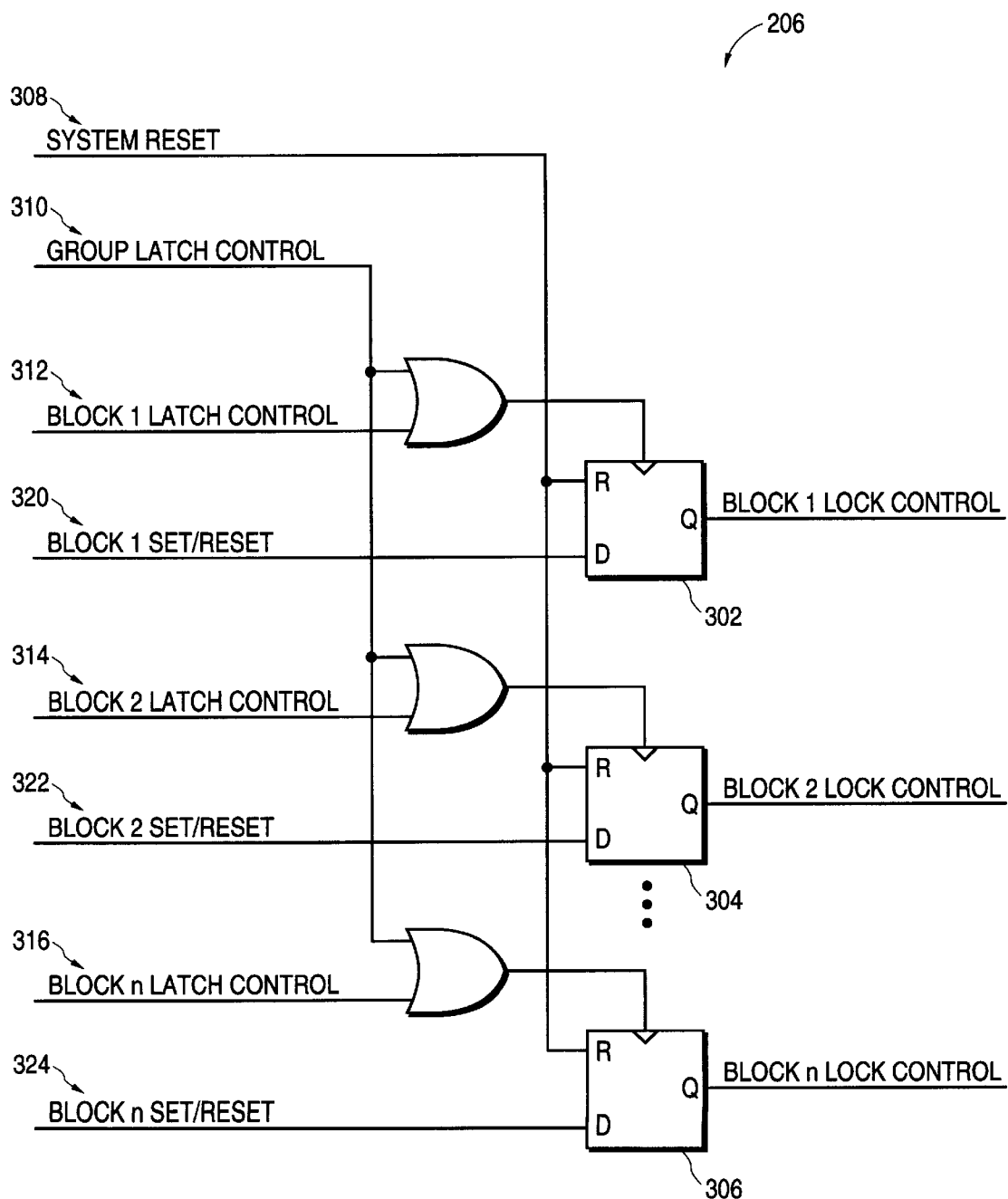
FIG. 3 is a circuit diagram of a block lock controller within the block controller of FIG. 2, according to one embodiment of the present invention.

FIG. 3 is a circuit diagram that illustrates in greater detail the internal structure of block control circuit 206, according to one embodiment of the present invention. The block control circuit 206 consists of a bank of latches with one latch for each of the lockable blocks in flash memory array 202. Each of the latches can be individually set or reset by a user using a standard command format. As illustrated in FIG. 3, the block control circuit 206 includes n D-type flip-flops or registers (D-type registers), 302 to 306, where n corresponds to the number of lockable blocks in the memory array coupled to circuit 206. For the example illustrated in FIG. 2, if each of the blocks in memory array 202 is capable of being locked, then for block control circuit 206, n=32. Although registers 302 to 306 in FIG. 3 are illustrated as D-type registers, block control circuit 206 may be implemented using of other types of digital latch or register circuits.

The Q output of each register 302 to 306 generates a block lock control signal that is input, through logic circuits that control write operations to memory, to a corresponding block in memory array 202. Thus, the output from register 302 is denoted "block 1 lock control" signal, the output from register 304 is denoted "block 2 lock control" signal, and so on. The D input to each of the registers 302 to 306 are connected to block set/reset lines 320 to 324 that are driven by commands generated from command buffer 204. The logic state of a block set/reset signal connected to a register determines the state of the lock control signal transmitted to the corresponding block in the memory array. In one embodiment of the present invention, a logic high ("1") block set/reset level will cause the corresponding block to be locked. Conversely, a logic low ("0") block set/reset level will cause the corresponding block to be unlocked.

In one embodiment of the present invention, the clock inputs to each of the registers 302 to 306 are driven by a latch control signal. The latch control signal is generated by a group latch control signal 310 that enables latching of all of the registers in a group, or by individual block latch control signals that enable only corresponding block control registers. In this manner, block set/reset commands must be synchronized with either a group latch control signal or individual block latch control signals 312 to 316 in order to lock or unlock the blocks in flash memory array 202. A system reset signal 308 is connected to the reset inputs of each of the registers 302 to 306 to allow a common reset of each of the block control registers upon the occurrence of a reset condition, such as a software reset or power-down condition.

In one embodiment of the present invention, the registers 302 to 306 comprising the block control circuit 206 in FIG. 3 are implemented in a volatile memory device, such as a static random access memory (SRAM) device. Typical SRAM devices feature much faster read/write cycle times than flash memory. Using volatile memory registers, thus allows much faster lock programming of flash memory blocks over present methods that use non-volatile memory tables to configure the lock configuration. For example, if such a configuration table is implemented in flash memory, a set or reset of the lock configuration may take up to one or two seconds (based on the erase cycles of typical flash cells). This update time represents a period of vulnerability in which the data may be corrupted by a spurious write operation. If the processor coupled to the memory is executing code on the order of millions of cycles per second, the possibility of a spurious write during the period of vulnerability is quite high. The use of volatile registers in embodiments of the present invention, thus minimizes this period of vulnerability by allowing reconfiguration of these volatile registers at cycle times approximating SRAM memory cycles or flash read times.

Lock-Down Block Lock Architecture

In one embodiment of the present invention, the volatile block lock architecture of FIG. 3, in which a bank of lock registers locks and unlocks corresponding memory blocks is used in conjunction with a lock-down circuit that locks blocks into a locked state and prevents any software modification of this locked status through the re-programming of the lock registers.

Figure 5:
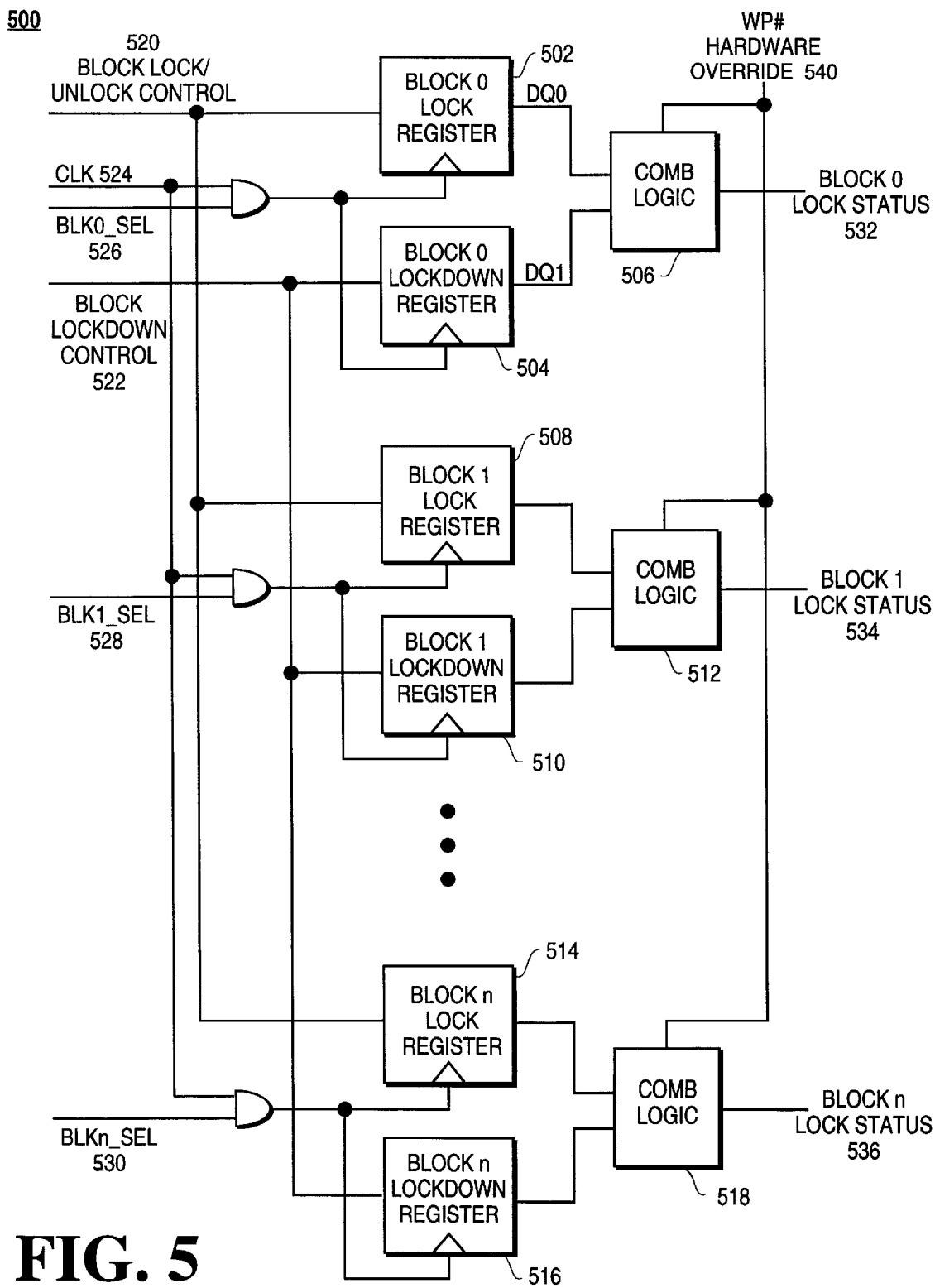
FIG. 5 is a circuit diagram of a block lock controller within the block controller of FIG. 2, according to an alternative embodiment of the present invention.

FIG. 5 is a circuit diagram of a block control unit that includes volatile block lock architecture and a lock-down circuit according to one embodiment of the present invention. In circuit 500, two separate registers are associated with each lockable block of the flash memory array. As illustrated in FIG. 5, the block control circuit 500 includes n pairs of D-type registers, where n corresponds to the number of lockable blocks in the memory array coupled to circuit 500. For the example illustrated in FIG. 2, if each of the blocks in flash memory array 202 is capable of being locked, then for block control circuit 206, n=32.

The block control circuit 500 consists of a bank of lock registers with one register for each of the lockable blocks in memory array 202. The lock registers for each of the n blocks illustrated in FIG. 5 are registers 502, 508, and 514, respectively. Each of the lock registers can be individually set or reset by a user using a standard command format. One command is used to lock a corresponding block and protect the block from further write or erase operations, and a second command is used to unlock the block and allow write or erase operations to the block.

In one embodiment of the present invention, a lock-down register is associated with each lock register. The lock-down registers for each of the n blocks illustrated in FIG. 5 are registers 504, 510, and 516, respectively. The lock-down registers operate to set a block into the locked state. Furthermore, once a locked block has been locked-down, that block cannot be unlocked through the reprogramming of the lock register by software. That is, once the lock-down register has been set, setting or resetting the lock register will have no effect on the locked status of the corresponding block. In one embodiment of the present invention, each lock-down register is programmed to its set state once and cannot be cleared by re-programming. In this case, a locked-down locked block can only be unlocked by a device reset or through the use of a special hardware override pin, as will be described in further detail below.

In one embodiment of the present invention, a block lock/unlock control signal 520 is transmitted to each of the lock registers, and a block lock-down control signal 522 is transmitted to each of the lock-down registers. Both of these control signals are generated by appropriate commands transmitted from command buffer 204. For each block, the outputs of the block lock register and block lock-down register are combined in combinatorial logic circuits to produce a lock status signal for the respective block. For block 0, logic circuit 506 combines the lock/unlock state from lock register 502 with the lock-down state from lock-down register 504 to produce block 0 lock status signal 532. Likewise, for block 1, logic circuit 512 combines the lock/unlock state from lock register 508 with the lock-down state from lock-down register 510 to produce block 1 lock status signal 534; and for block n, logic circuit 518 combines the lock/unlock state from lock register 514 with the lock-down state from lock-down register 516 to produce block n lock status signal 536.

In one embodiment of the present invention, the clock input for the lock and lock-down registers for each block receive a clock and block select signal for that particular block. The block select signal selects a particular block and synchronizes with the clock signal to trigger the latch function that generates the lock status output signal for that block. Clock signal 524 and block 0 select signal 526 (BLK0_SEL) are combined and input to the lock and lock-down registers for block 0. Likewise, clock signal 524 and block 1 select signal 528 (BLK1_SEL) are combined and input to the lock and lock-down registers for block 1; and clock signal 524 and block n select signal 530 (BLKn_SEL) are combined and input to the lock and lock down registers for block n.

In an alternative embodiment of the present invention, separate clock and block select signals are input to the lock and lock-down registers. This provides some decoupling of the lock and lock-down registers associated with each lockable block, and allows each of the registers to be clocked and selected independently of the other register in the pair.

Hardware Override

In one embodiment of the present invention, a hardware override signal 540 is provided to block control circuit 500. For the embodiment illustrated in FIG. 5, the hardware override signal is input to the combinatorial logic circuits 506, 512, and 518 for each of the n blocks in circuit 500. Hardware override signal (also referred to as the write protect signal, WP#) 540 is provided through a write-protect pin to the chip containing the block control circuit. The hardware override signal operates to temporarily negate the lock-down register of a block. For example, in a first state, the hardware override signal has no effect on the lock-down state of a particular block. However, if the hardware override signal is maintained in a second state, the lock-down status of the block is disabled, and that block may then be locked or unlocked using the lock register.

In the block control circuit of FIG. 5, each block of the flash memory array can be locked or unlocked using software commands that change the protection status of the block. The protection status can be set to one of the following three states, Locked, Unlocked, and Lock-Down.

Locked blocks are fully protected from alteration. Any program or erase operations attempted on a locked block will return an error to a status register. The status of a locked block can be changed to unlocked or lock-down using appropriate software commands. Unlocked blocks can be programmed or erased. The status of an unlocked block can be changed to a locked state using appropriate software commands. Locked-down blocks are protected from program and erase operations (just like locked blocks), but their protection status cannot be changed using software commands alone. The hardware override signal 540 (WP#) provides hardware interaction to temporarily override the lock-down state.

FIG. 6 is a table that illustrates the lock status of each of the blocks depending on the state of the lock, lock-down, and write-protect control signals, according to one embodiment of the present invention. In table 600, $DQ_0$ and $DQ_1$ represent output pins from a pair of lock and lock-down registers corresponding to a particular block, and WP# represents the hardware override pin. With reference to FIG. 5, for block 0, pin $DQ_0$ corresponds to the output from the lock register 502, pin $DQ_1$ corresponds to the output from the lock-down register 504, and WP# corresponds to hardware override line 540.

In table 600, the current locking state of a block is defined by the state of the WP# signal and the two bits of the block lock states ($DQ_0$ and $DQ_1$). $DQ_0$ indicates if a block is locked (1) or unlocked (0); and $DQ_1$ indicates if a block is locked-down (1) or not (0). The notation [xyz] denotes the next state, where x=WP#, y=$DQ_0$, and z=$DQ_1$. The "Erase/Program Allowed?" column indicates whether erase and program operations are enabled (Yes) or disabled (No) in that block's current locking state. The "Lock Command Input Result (Next State)" column shows the result of writing the three locking commands (Lock, Unlock, Lock-down) in the current locking state.

As shown in table 600, when the WP# line is set to logic low ("0"), the lock-down register signal, $DQ_1$, will prevent programming and erasing of its associated flash block. Thus, when WP# is low and $DQ_1$ is high, no erase or program operations are allowed regardless of the state of the lock register signal, $DQ_0$. The preventative function of the lock-down register can be temporarily suspended by setting the WP# signal to a logic high ("1"), When the WP# line is set to logic high, the state of the lock-down register signal, $DQ_1$, will have no effect. In this case, the lock configuration of the block depends on the state of the lock register signal, $DQ_0$. When the WP# is at a logic high level, the lock registers can be modified by software commands without restriction, even if the associated lock-down registers are asserted (logic high). When the WP# goes low from a high state, blocks that were previously locked-down return to the lock-down state regardless of any changes made while WP# was high. In one embodiment, device reset or power-down conditions reset all blocks, including those in lock-down, to a locked state.

Command Definitions

In one embodiment of the present invention, programming of the block controller 500 is accomplished using two-cycle commands generated from command buffer 204. Command buffer 204 (also referred to as Command User Interface, "CUI") serves as the interface between the processor and block controller 500. In general operations, a program setup command is written to the command buffer followed by a second write that specifies the address and data to be programmed.

Although specific command names and hexadecimal op-code values are provided in the discussion that follows, it is to be noted that such names and values are meant to be exemplary, and that embodiments of the present invention are not limited to these specific names and values.

FIG. 7 is a table that lists the commands that are used in conjunction with block controller circuit 500 to control the lock status of the blocks of the flash array, according to one embodiment of the present invention. As stated previously with reference to the embodiment illustrated in FIG. 5, each block of the flash array can be set to a locked, unlocked, or lock-down state.

An unlocked block can be locked by writing a specific lock command sequence (e.g., 60H followed by 01H); a locked block can be unlocked by writing a specific unlock command sequence (e.g., 60H followed by D0H); and a locked or unlocked block can be locked-down by writing a specific lock-down command sequence (e.g., 60H followed by 2FH).

In one embodiment of the present invention, setting a lock-down register is a one-time operation. A locked-down block cannot be taken out of the locked-down state by software. Thus, once set, a locked-down block can only be taken out of the lock-down state by a hardware reset condition.

In an alternative embodiment of the present invention, the lock-down registers can be reset by a software command once set to the lock-down state. In this case, a locked-down block can be unlocked by a hardware reset or by software commands that de-assert the lock-down register and then unlock the block. The approach of this alternative embodiment, however, does not fully protect against inadvertent unlocking of blocks from possible spurious command sequences, but does offer the convenience of allowing reprogramming of the lock-down state through software rather than through hardware operations.

FIG. 8 is a table that lists a summary of the commands used to lock and lock-down the blocks of a flash array controlled by block controller 500, according to one embodiment of the present invention. The hexadecimal data values provided in table 800 correspond to the command labels and data values illustrated in table 700 of FIG. 7. The functions of each of the commands is described in relation to the effect of the command on the Command User Interface (CUI) and the flash memory blocks that are being configured. It should be noted that the actual hexadecimal data values and command names are provided in FIGS. 7 and 8 are intended to be exemplary, and that alternative embodiments of the present invention may use different values and command names.

Figure 4:
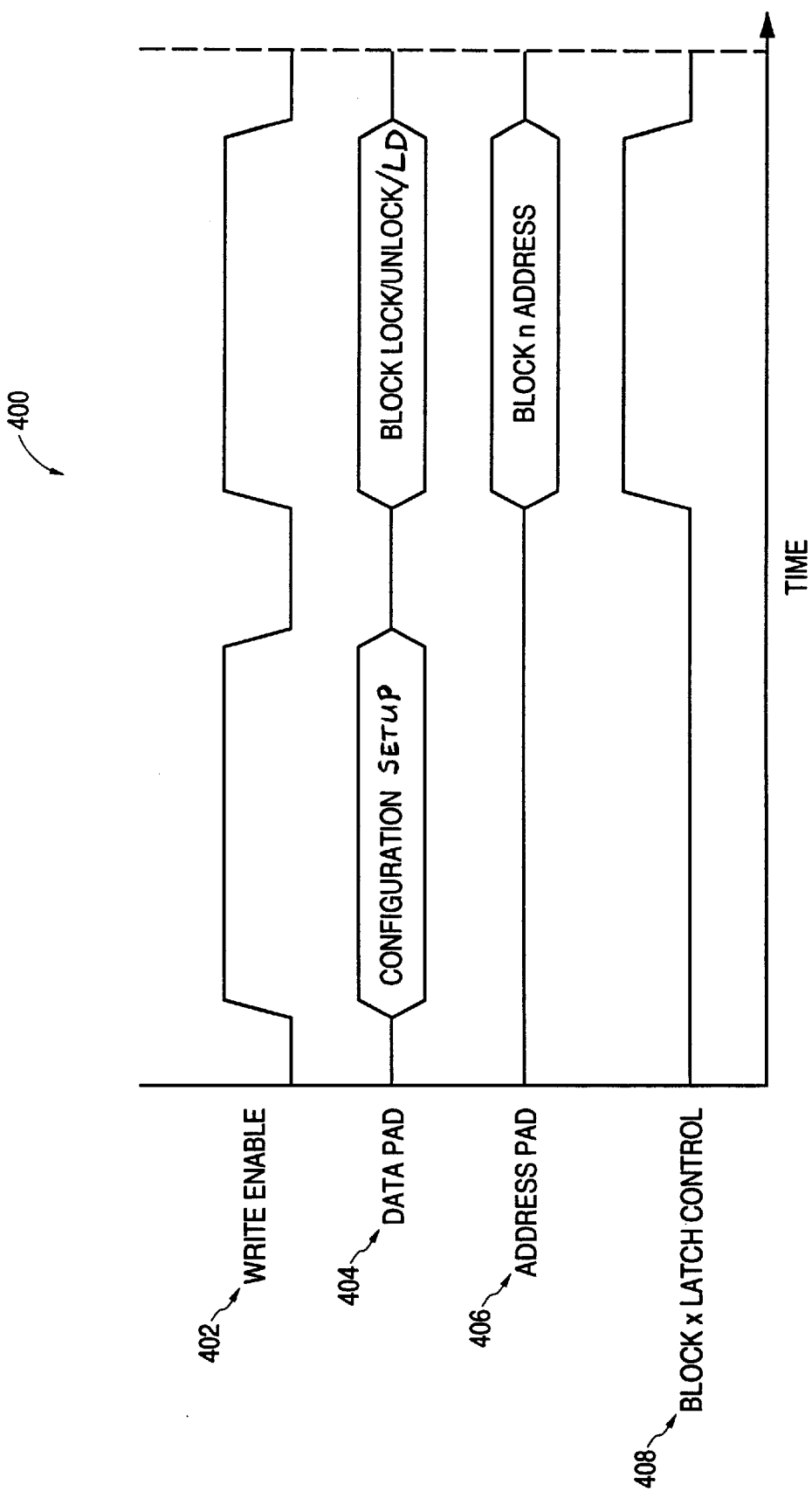
FIG. 4 is a timing diagram illustrating the sequence of execution of a block lock/unlock command, according to one embodiment of the present invention.

FIG. 4 is a timing diagram illustrating the sequence of execution of a block lock/unlock command according to one embodiment of the present invention. The data line 404 transmits the two-cycle command that specifies a block lock configuration is to be changed, and the new lock configuration of the block. The two cycles of the command on the data line are valid during positive cycles of the write enable signal 402. For each two-cycle command, the address 406 input to memory 104 is decoded to determine which lock bit to set or reset. The configuration command takes effect on the block specified by the address upon a positive-going cycle of the block latch control signal 408.

In one embodiment of the present invention, the first cycle of the command on data pad 404 is a configuration set-up command that prepares the CUI for changes to the device configuration, such as block locking changes. The second cycle of the command on data pad 404 is a block configuration command that specifies whether the block is to be locked, unlocked, or locked-down (LD). The actual command codes and command descriptions for the two cycles of the configuration command are provided in table 800 of FIG. 8.

In FIG. 4, the write commands to lock or unlock blocks in flash memory array 202, were illustrated as two-cycle commands. In an alternative embodiment of the present invention, single cycle commands are used. Single-cycle commands specify, in one cycle, the locked or unlocked configuration of a block to be reconfigured. Similarly, in further alternative embodiments of the present invention, multi-cycle commands (consisting of three or more cycles) are used to configure the flash blocks to locked or unlocked states.

Retaining Lock Settings

In one embodiment of the present invention, the default state of the blocks, i.e., the state of the blocks upon power up or following a reset, is that the blocks are in a locked state with no lock-down. Thus, all unlocked blocks return to the locked state when the device is reset or powered down, and similarly locked-down blocks revert to the locked state when the device is reset or powered down. Following power up or reset, a user must unlock blocks to be written to, or lock-down blocks intended to be locked-down. It should be noted that other default states are possible, such as blocks powered up in an unlocked state, or powered up in a locked state with lock-down set.

In one embodiment of the present invention, both the lock registers and lock-down registers for the block lock controller 500 in FIG. 5 are implemented as volatile SRAM registers. Although volatile memory registers allow a much faster lock/unlock configuration of the blocks in the flash memory array, the SRAM registers lose their settings when power is removed from the block lock controller circuit.

In one embodiment of the present invention, the state of the lock and lock-down registers is stored in a portion of the flash memory. In one embodiment, this portion is a mini-array that is separate from the main flash array. Upon power-down, a system software routine writes the settings of each volatile register to the flash memory. A flash bit stores the setting for each volatile register. In this manner, the volatile register settings are maintained when the circuit is powered down. Upon power-up, the lock/unlock and lock-down settings for each block are read from the flash memory and used to set the appropriate registers accordingly. The step of writing from flash memory to the registers typically occurs during the boot-up period of the computer system or device in which the block controller 500 is used, thus the latency associated with reading from the flash does not significantly impact the security of the device during lock protection cycles.

In an alternative embodiment of the present invention, lock/unlock and lock-down settings programmed into the volatile block control registers is retained during power-down conditions using a shadowing scheme. In this alternative embodiment, the setting of each register is stored in a non-volatile memory cell, as each register is programmed. The non-volatile memory could be flash memory within the flash array or other non-volatile memory, such as a disk, tape, or the like. The step of writing the shadowed settings to the non-volatile memory occurs separately from the actual setting of the volatile registers, and thus the latency incurred through writing to these slower memory sources is does not significantly impact the security of the device. In the shadowing scheme of this alternative embodiment, upon power-up, the lock configuration is already stored in non-volatile memory so additional software to monitor the settings of the block controller registers is not required, thus reducing software overhead.

Figure 9:
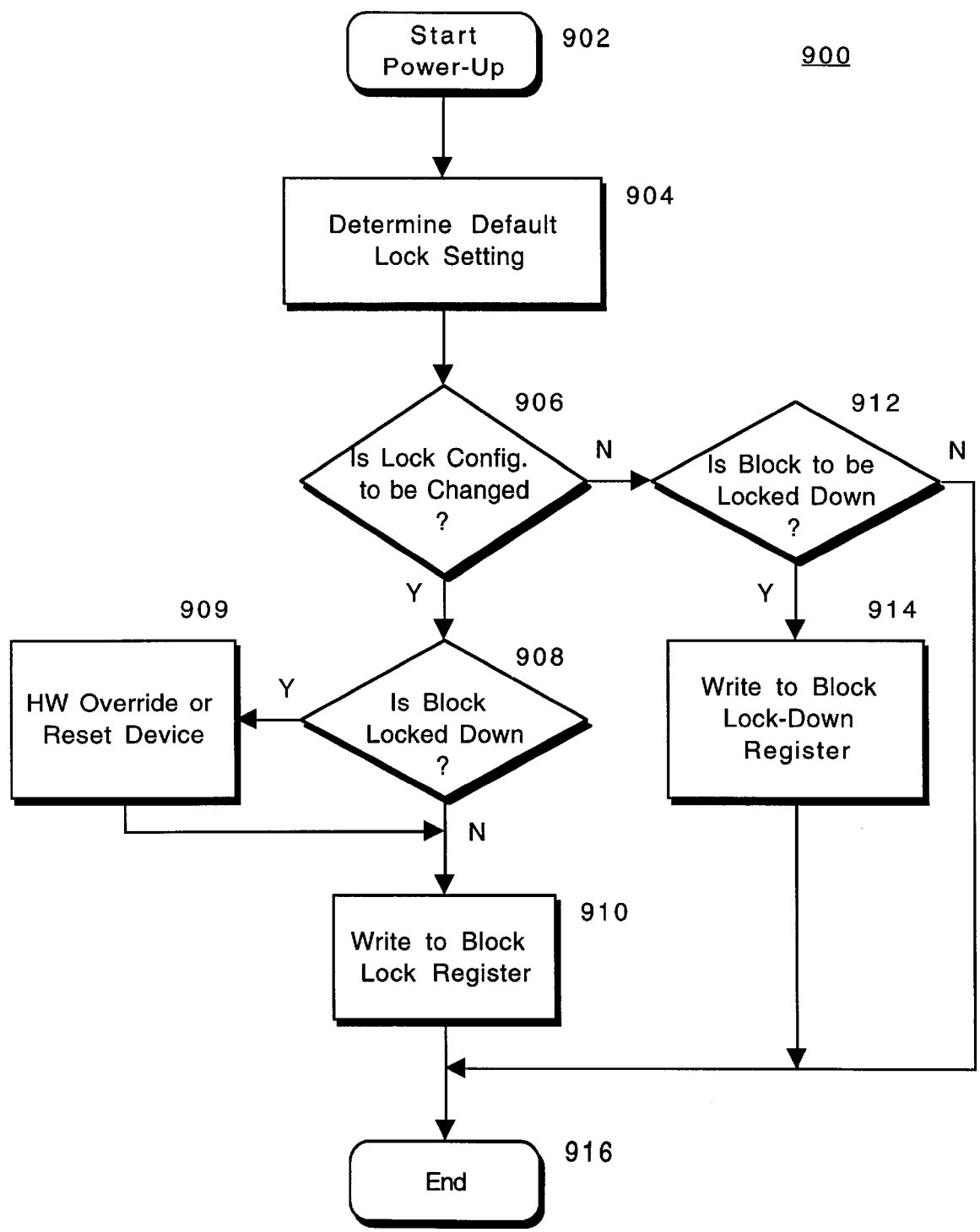
FIG. 9 is a flowchart illustrating the steps of locking and unlocking blocks of a flash memory array according to a method of the present invention.

FIG. 9 is a flowchart that illustrates the steps of setting the lock configuration of a flash memory array according to one embodiment of the present invention. The process illustrated in flowchart 900 starts with step 902 in which the system containing the flash memory array is powered up. Upon power up the default lock setting of the flash array is determined, step 904. The default lock setting of the flash array can be configured such that all of the blocks of the flash array are powered up in a locked state or in an unlocked state. Alternatively, the default block setting of the flash array can be restored from a previously stored state using either a software routine or hardware mechanism, as described above. For example, the default setting could be determined by reading a non-volatile memory configuration table, in which the settings were stored upon a previous power down; or alternatively by reading the non-volatile table in which the settings were written to as the registers were set.

In step 906 it is determined whether the lock configuration of a block in the memory array is to be changed, that is, whether a locked block is to be unlocked or an unlocked block is to be locked. If a block is to be locked or unlocked, it is next determined whether the block is in the lock-down mode, step 908. If the block is not locked down the user may write to the block lock register to change the state of the block to either the locked or unlocked state, step 910.

In step 906 once the default lock setting for a block has been determined and the block is not to be locked or unlocked, the user may choose to set the block to a locked-down state, step 912. If, in step 912, it is determined that the block is not to be locked-down the process ends at step 916. If, however, in step 912 it is determined that the block is to be locked down, the user may write to the block lock-down register corresponding to that block and set the appropriate bits, step 914. At this point the process ends at step 916 with regard to configuration of that particular block.

If, in step 906, it is determined that a block is to be locked or unlocked yet, in step 908 it is determined that the block is locked down, the lock-down state must first be cleared since locking or unlocking of the block through software is disallowed. In this case it is necessary to override the block lock-down setting. This can be accomplished by either performing a hardware override using the write protection pin, or by resetting the device, step 909. After the lock-down state of the block has been cleared, that block can be locked or unlocked by writing to the block-lock register, step 910. At this point the process ends at 916 with regard to the lock setting for that particular block.

Figure 10:
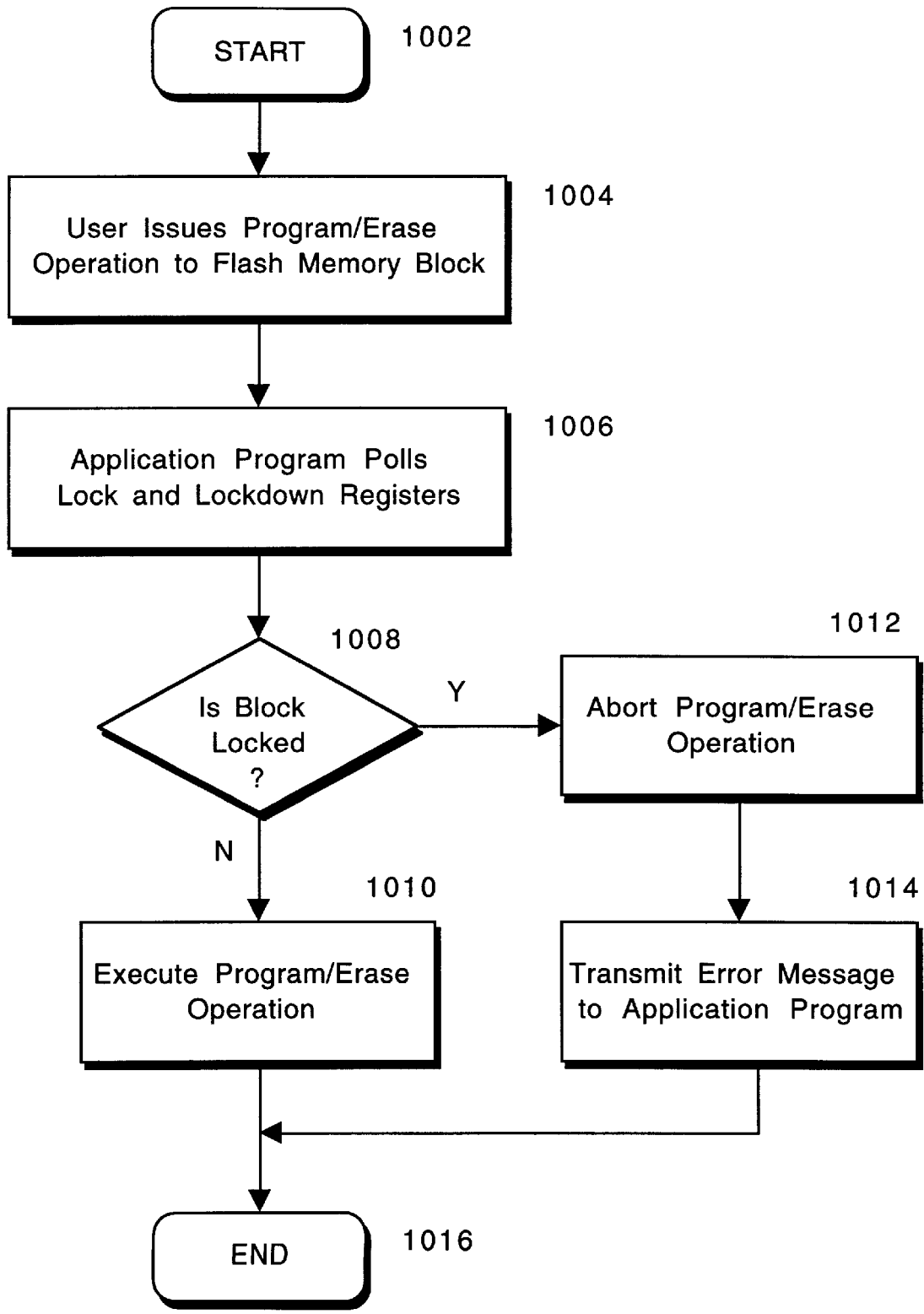
FIG. 10 is a flowchart illustrating the use of the block lock controller by an application program, according to one embodiment of the present invention.

FIG. 10 is a flowchart illustrating the use of the block lock controller by an application program, according to one embodiment of the present invention. The process starts in step 1002. In step 1004 a program or erase operation is issued to a flash memory block. This is typically accomplished by a user performing a read or write operation within an application program that accesses the flash memory. In step 1006 the application program polls the lock and lock-down registers within the block lock controller and corresponding to the memory block being accessed. In step 1008 it is determined whether or not the memory block is locked. If, in step 1008, it is determined that the memory block is not locked the program or erase operation is executed and the new data is written to the flash memory block, step 1010. If, however, in step 1008, it is determined that the memory block is locked, the program or erase operation is aborted, step 1012. An error message is then transmitted to the application program to indicate an unsuccessful program or erase attempt, step 1014. At the point the process ends, step 1016.

Embodiments of the present invention, as exemplified by FIGS. 3 and 5 are used in applications requiring secure storage of sensitive or vulnerable data or code. The incorporation of a lock-down state in addition to a lock or unlocked state provides secure storage of code or data that is not intended to be changed, or is only intended to be changed under special circumstances. For example, boot code or system data may be stored in blocks of flash memory that are locked-down. This will prevent unintended writes to the lock registers or other spurious conditions from unlocking these critical blocks and allowing them to be modified or erased. Data or code that is frequently updated may be stored in blocks that are locked but not locked down, thus facilitating ease of modification. The use of volatile lock and lock-down registers allows real-time data protection by minimizing the lock and unlock cycle times, and hence the period of vulnerability of the non-volatile memory to data corruption during these cycle times.

In the foregoing, a circuit has been described for flexibly locking or unlocking blocks in a flash memory array. Although the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

What is claimed is:

1. An apparatus comprising:
   a non-volatile memory array including a plurality of blocks, one or more blocks of said plurality of blocks being capable of being placed in a locked state or an unlocked state;
   a volatile lock register coupled to a block of said one or more blocks;
   a volatile lock-down register coupled to said block of said one or more blocks;
   a hardware override line coupled to said lock register and said lock-down register, said hardware override line temporarily disabling said lock-down register when said hardware override line transmits a signal set to a first logic state;
   a block lock control line coupled to said lock register and transmitting a lock control signal to said lock resister;
   a block lock-down control line coupled to said lock-down register and transmitting a lock-down control signal to said lock-down register; and
   a block select control line coupled to each of said lock register and said lock-down register.

2. The apparatus of claim 1 further comprising a logic circuit coupled to an output of said lock register and an output of said lock down register, said logic circuit transmitting a lock status control signal to said block, and wherein said hardware override line is coupled to said logic circuit.

3. The apparatus of claim 2 wherein,
   said lock control signal programs said lock register to a first lock state or a second lock state, said first lock state preventing said block from being programmed or erased; and
   said lock-down control signal programs said lock-down register to a first lock-down state or a second lock-down state, said first lock-down state preventing said block from being programmed or erased and further preventing programming of said lock register to allow said block to be programmed or erased.

4. The apparatus of claim 3 wherein said hardware override line transmits a write protect signal having a first write protect state or a second write protect state, said first write protect state preventing said lock-down register from preventing said lock register to allow said block to be programmed or erased.

5. The apparatus of claim 4 wherein said non-volatile memory array is a flash memory and said lock register and said lock-down register are both embodied in static random access memory circuits.

6. An apparatus comprising:
   a non-volatile memory array including a plurality of blocks, one or more blocks of said plurality of blocks being capable of being placed in a locked state or an unlocked state;
   a set of volatile lock registers, each lock register of said set of lock registers coupled to a corresponding block of said one or more blocks, and operable to prevent corresponding blocks from being modified;
   a set of volatile lock-down registers, each lock-down register of said set of lock-down registers being associated with a lock register of said set of volatile lock registers and operable to prevent said corresponding blocks from being modified, and further operable to prevent said set of lock registers to be programmed to allow said corresponding blocks to modified;

a hardware override line coupled to said set of lock registers and said set of lock-down registers, said hardware override line operable to temporarily disable operation of said set of lock-down registers; and a command buffer coupled to said set of lock registers and said set of lock-down registers, said command buffer operable to transmit a two-cycle command to each register of both said set of lock registers and said set of lock-down registers, wherein the first cycle comprises a command specifying whether a lock configuration of said non-volatile memory array is to be changed, and the second cycle comprises a command specifying whether a block of said memory array is to be placed in a lock state, an unlocked state, or a locked-down state.

7. The apparatus of claim 6 wherein said locked state corresponds to a lock register of said set of lock registers being programmed to a first logic state, said unlocked state corresponds to said lock register being programmed to a second logic state, and said locked-down state corresponds to a lock-down register of said set of lock-down registers being programmed to a first logic state.

8. The apparatus of claim 7 wherein said lock-down state prevents programming of lock registers to allow corresponding blocks of said non-volatile memory array to be modified.

9. The apparatus of claim 8 wherein said hardware override line is operable to temporarily override said lock-down state to thereby allow programming of said lock registers to allow said corresponding blocks of said non-volatile memory to be modified regardless of the lock-down state of corresponding lock-down registers.

10. The apparatus of claim 9 wherein said non-volatile memory array is a flash memory and said first set of lock registers and said set of lock-down registers are embodied in static random access memory circuits.

11. The apparatus of claim 10 wherein said lock-down registers are capable of being set to a lock-down only once during a period in which said apparatus is powered-up.

* * * * *